United States Patent
Singh et al.

(10) Patent No.: US 12,419,015 B2
(45) Date of Patent: Sep. 16, 2025

(54) SECONDARY COOLING SYSTEM FOR CONTROL MODULES

(71) Applicant: GM GLOBAL TECHNOLOGY OPERATIONS LLC, Detroit, MI (US)

(72) Inventors: Gurhari Preet Singh, Toronto (CA); Karl Bo Albert Mikkelsen, Peachland (CA); Rolf B. Karlsson, Grand Blanc, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 248 days.

(21) Appl. No.: 18/312,698

(22) Filed: May 5, 2023

(65) Prior Publication Data

US 2024/0373597 A1 Nov. 7, 2024

(51) Int. Cl.
H05K 7/20 (2006.01)
B60R 21/26 (2011.01)

(52) U.S. Cl.
CPC ......... *H05K 7/20881* (2013.01); *B60R 21/26* (2013.01); *B60R 2021/26017* (2013.01)

(58) Field of Classification Search
CPC .......... H05K 7/20881; H05K 7/20281; H05K 7/20272; B60R 21/26; B60R 2021/26017
See application file for complete search history.

Primary Examiner — Emmanuel E Duke

(57) ABSTRACT

A cooling system includes a reactant material, a reactive material, a thermally managed control module, and a plunger. The reactive material is spaced apart from the reactant material. The thermally managed control module is configured to receive coolant from a coolant supply reservoir via a coolant supply channel. The plunger is movable between a retracted position and an extended position. When a temperature of the thermally managed control module is greater than a predetermined temperature, an actuator is configured to transition the plunger from the retracted position to the extended position and cause the reactive material to mix with the reactant material to create a second coolant via an endothermic reaction, and the second coolant enters the thermally managed control module via the coolant supply channel.

20 Claims, 7 Drawing Sheets

SECONDARY COOLING SYSTEM FOR CONTROL MODULES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to a cooling system, and more specifically, to a secondary cooling system for control modules.

Vehicles include one or more control modules. Some control modules run an algorithm to perform one or more functions. Examples of control modules include steering control modules, brake control modules, camera control modules, infotainment control modules, power inverter control modules, auxiliary power control modules, direct current (DC) to DC converter control modules, and another control modules.

The control module may include a thermistor. The thermistor is configured to measure a temperature of the control module. When the control module performs the functions, a temperature of the control module may rise. In other words, the control module may generate heat when performing functions. The control module is configured to detect when the temperature of the control module is greater than a predetermined temperature.

A cooling system may maintain the temperature of the control module below the predetermined temperature. The cooling system uses a coolant. The coolant is supplied to the control module via one or more coolant channels.

SUMMARY

An example cooling system includes a reactant material, a reactive material, a thermally managed control module, and a plunger. The reactive material is spaced apart from the reactant material. The thermally managed control module is configured to receive coolant from a coolant supply reservoir via a coolant supply channel. The plunger movable between a retracted position and an extended position. When a temperature of the thermally managed control module is greater than a predetermined temperature, an actuator is configured to transition the plunger from the retracted position to the extended position and cause the reactive material to mix with the reactant material to create a second coolant via an endothermic reaction, and the second coolant enters the thermally managed control module via the coolant supply channel.

In one example, the example cooling system includes a plunger channel in fluid communication with the coolant supply channel and housing the plunger and the actuator.

In one example, the actuator is a ram. When the temperature of the thermally managed control module is greater than the predetermined temperature, the ram drives movement of the plunger from the retracted position to the extended position.

In one example, the example cooling system includes a first sealing disk disposed between the reactant material and the reactive material, and a second sealing disk disposed between the reactive material and the coolant supply channel.

In one example, the plunger is disposed within the plunger channel when in the retracted position, and the plunger extends transversely across the coolant supply channel and ruptures the first and second sealing disks when transitioning from the retracted position to the extended position.

In one example, the plunger includes a channel and the channel carries the second coolant to the coolant supply channel when the plunger is in the extended position.

An example cooling system includes a fluid tank, a solute reservoir, and a thermally managed control module. The fluid tank contains a fluid. The solute reservoir is disposed within the fluid tank and containing an endothermic solute. The thermally managed control module has a coolant channel extending through the thermally managed control module and the coolant channel is configured to receive a coolant. When a temperature of the thermally managed control module is greater than a predetermined temperature, an actuator is configured to release the endothermic solute from the solute reservoir into the fluid tank and cause the endothermic solute to mix with the fluid to create a second coolant via an endothermic reaction, and the second coolant enters the thermally managed control module via a coolant supply channel.

In one example, the example cooling system includes a gas cylinder and a release valve. The gas cylinder is attached to the solute reservoir and filled with a pressurized gas. The release valve is disposed between the gas cylinder and the solute reservoir and movable between an open position and a closed position. When the temperature of the thermally managed control module is greater than the predetermined temperature, the actuator is configured to transition the release valve from the closed position to the open position and allow the pressurized gas to flow from the gas cylinder to the solute reservoir and release the endothermic solute from the solute reservoir into the fluid.

In one example, the example cooling system includes a bypass trigger disposed between the gas cylinder and the solute reservoir, and an airbag control module configured to activate the bypass trigger based on an activated state of an airbag. When the bypass trigger is activated, the bypass trigger is configured to allow the pressurized gas to flow from the gas cylinder to the solute reservoir and release the endothermic solute from the solute reservoir into the fluid tank to create the second coolant via the endothermic reaction, and the second coolant enters the coolant channel of the thermally managed control module via the coolant supply channel.

In one example, the example cooling system includes a pump disposed outside the thermally managed control module and configured to pump the coolant from an outlet of the coolant channel to an inlet of the coolant channel.

In one example, the example cooling system includes a mechanical valve disposed between the pump and the inlet of the coolant channel and movable between an open position and a closed position. When a coolant temperature of the coolant is above a predetermined coolant temperature, the coolant transitions the mechanical valve from the closed position to the open position and causes the endothermic solute to release from the solute reservoir into the fluid tank to create the second coolant via the endothermic reaction, and the second coolant enters the coolant channel of the thermally managed control module via the coolant supply channel.

In one example, the thermally managed control module includes a cold plate and the coolant channel extends through the cold plate.

In one example, the example cooling system includes the thermally managed control module includes a second coolant channel extending through a second cold plate and the second coolant channel is configured to receive the second coolant from the fluid tank via the coolant supply channel.

An example cooling system includes a fluid tank, a thermally managed control module, and a coolant channel. The fluid tank is at least partially filled with a fluid. The fluid has a fluid temperature. The thermally managed control module is disposed within the fluid tank. The coolant channel extends through the fluid tank and is configured to receive a coolant to cool the fluid in the fluid tank. When the fluid temperature of the fluid is greater than a predetermined temperature, an actuator is configured to cool the fluid temperature to less than the predetermined temperature by at least one of evaporating the fluid and mixing the fluid with an endothermic solute.

In one example, the example cooling system includes a solute reservoir disposed within the fluid tank and containing the endothermic solute. When the fluid temperature is greater than the predetermined temperature, the actuator is configured to release the endothermic solute from the endothermic solute into the fluid of the fluid tank using a release assembly.

In one example, the release assembly includes an impeller disposed adjacent to the solute reservoir and rotation of the impeller pierces a sidewall of the solute reservoir such that the endothermic solute is released into the fluid of the fluid tank.

In one example, the release assembly includes a magnet disposed inside the solute reservoir and a solenoid disposed outside the solute reservoir. The solenoid attracts the magnet and pierces a sidewall of the solute reservoir such that the endothermic solute is released into the fluid of the fluid tank.

In one example, the release assembly includes a fuse disposed inside the solute reservoir, and current traveling through the fuse is configured to melt a sidewall of the solute reservoir such that the endothermic solute is released into the fluid of the fluid tank.

In one example, the fluid tank is at least partially filled with a gas.

In one example, the example cooling system includes a pressure relief valve movable between an open position and a closed position. When the fluid temperature is greater than the predetermined temperature, the fluid in the fluid tank evaporates and the gas causes the pressure relief valve to transition from the closed position into the open position to release the gas from the fluid tank via a vent.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A vehicle includes wheels, a steering wheel, brakes, and a brake pedal. The steering wheel is operated by a driver of the vehicle to adjust a direction of the wheels, and therefore guide a direction of travel of the vehicle. The brake pedal is operated by the driver of the vehicle to activate the brakes and reduce a speed of the vehicle.

Control modules execute instructions to perform functions. One example of a control module is a steering control module. The steering control module is configured to control the direction of the wheels based on an angular position of the steering wheel. In another example, the control module may be a brake control module. The brake control module is configured to control the brakes of the vehicle based on a position of the brake pedal of the vehicle. Other examples of control modules include camera control modules, infotainment control modules, power inverter control modules, auxiliary power control modules, DC to DC converter control modules, and another control module.

When a control module performs functions, a temperature of the control module may rise. A cooling system may maintain the temperature of the control module below a predetermined temperature. The cooling system uses a coolant to cool the control module.

However, the cooling system may not supply enough coolant to the control module to maintain the temperature of the control module below the predetermined temperature under some circumstances. For example, there may be a leak in cooling channels that supply coolant from a coolant reservoir to the control module. In another example, the coolant reservoir may have a little amount of coolant. In yet another example, a coolant pump configured to pump coolant from the coolant reservoir to the control module may fail and therefore, coolant may not be pumped for cooling.

In view of the above, a secondary cooling system and a method for secondary cooling is provided for supplying coolant to the control module when the temperature of the control module is greater than the predetermined temperature.

Figure 1:
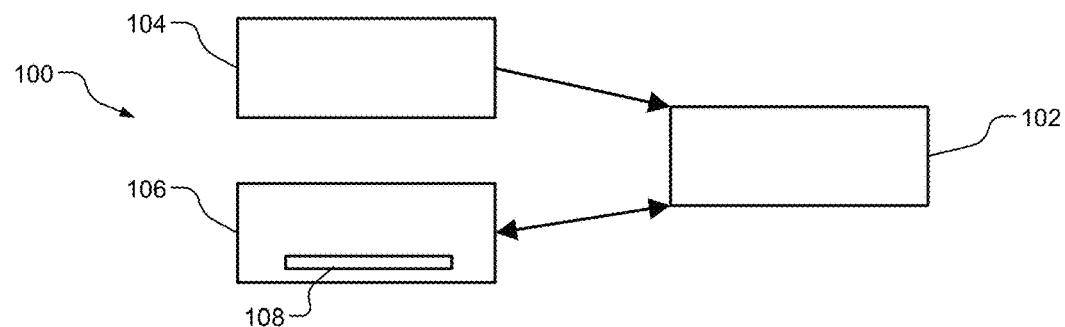
FIG. 1 is a functional diagram of an example cooling system.

Referring now to FIG. 1, a functional block diagram of an example cooling system 100 is presented. The example cooling system 100 includes a thermally managed control module 102, a first cooling system 104, and a second cooling system 106.

The cooling system 100 is described as a cooling system for a thermally managed control module of a vehicle. However, the cooling system may also be used for thermally managed control modules of non-vehicles.

The first cooling system 104 includes a coolant reservoir, first coolant channels, and a coolant. The first coolant channels are in fluid communication with the coolant reservoir and the thermally managed control module 102. Coolant is pumped from the coolant reservoir to the thermally managed control module 102 to cool the thermally managed control module 102.

In some configurations, the first cooling system 104 may include heat exchangers. Examples of heat exchanges include radiators, chillers or another suitable heat exchanger. The heat exchangers are configured to remove heat from the coolant and thereby cool the thermally managed control module 102.

When a temperature of the thermally managed control module 102 is greater than a predetermined temperature, an actuator 108 of the second cooling system 106 is configured to cause the temperature of the thermally managed control module 102 to decrease below the predetermined temperature. The actuator 108 may be a mechanical actuator, an electrical actuator, or a combination thereof. In one example, the actuator 108 of the second cooling system 106 is configured to cool the thermally managed control module 102 by triggering a reaction between a first material (e.g., solute, reactive material) and a second material (e.g., fluid, reactant material) to create an endothermic coolant, and the second cooling system 106 supplies the endothermic coolant to the thermally managed control module 102. In another example, the actuator 108 of the second cooling system 106 is configured to cause cooling of the thermally managed control module 102 by cooling (e.g., evaporating) a fluid in which the thermally managed control module 102 is disposed within.

Figure 2:
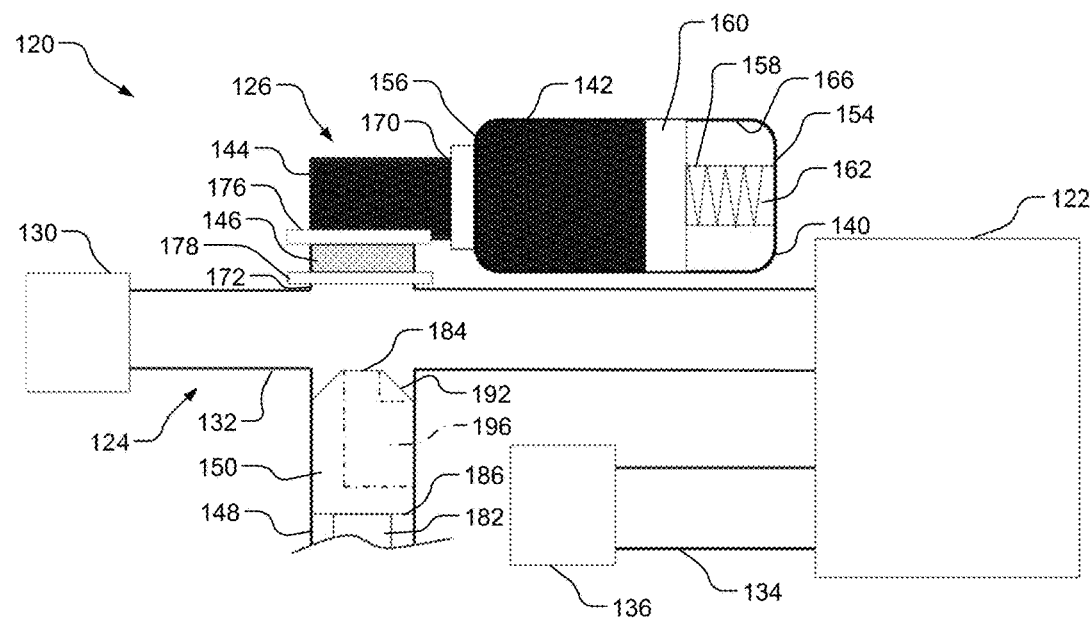
FIG. 2 is a schematic diagram of an example cooling system in a first position.
Figure 3:
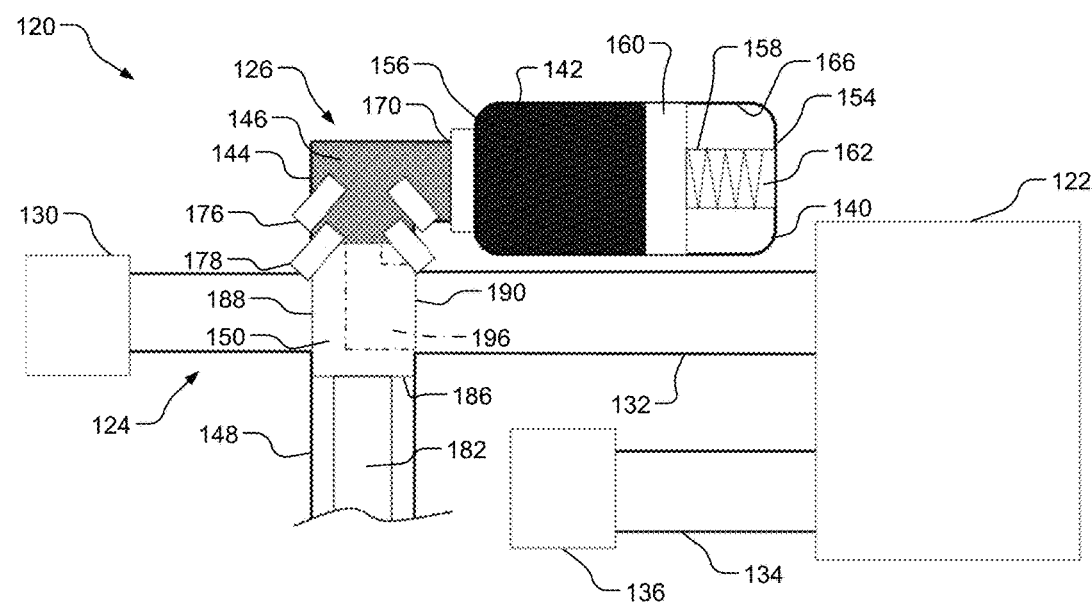
FIG. 3 is a schematic diagram of the example cooling system in a second position.
Figures 4, 5:
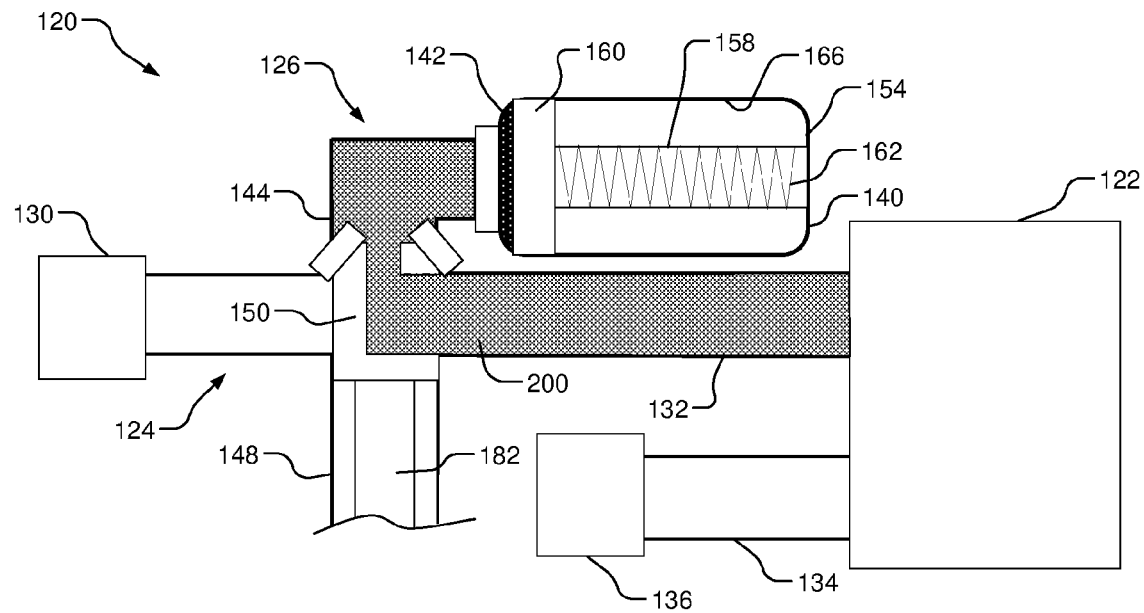
FIG. 4 is a schematic diagram of the example cooling system in a third position.
FIG. 5 is a schematic diagram of an example cooling system.

FIG. 2 is a schematic diagram of an example cooling system 120 in a first position. FIG. 3 is a schematic diagram of the example cooling system 120 in a second position. FIG. 4 is a schematic diagram of the example cooling system 120 in a third position.

The cooling system 120 includes a thermally managed control module 122, a first cooling system 124, and a second cooling system 126. The first cooling system 124 may include a coolant supply reservoir 130, a coolant supply channel 132, a coolant release channel 134, and a coolant release reservoir 136. The coolant supply channel 132 and the coolant release channel 134 may collectively be referred to as a coolant channel.

The coolant supply channel 132 extends from the coolant supply reservoir 130 to the thermally managed control module 122. The coolant supply channel 132 is in fluid communication with the thermally managed control module 122. The coolant supply channel 132 carries coolant from the coolant supply reservoir 130 to the thermally managed control module 122. In the illustrated example, the coolant supply channel 132 is shaped in a linear shape and positioned perpendicular to the thermally managed control module 122. However, the coolant supply channel 132 may be shaped in another suitable shape and positioned in another suitable position.

The coolant release channel 134 is in fluid communication with the thermally managed control module 122. The coolant release channel 134 is attached to a coolant release reservoir 136. In some configurations, the coolant release reservoir 136 is arranged in fluid communication with the coolant supply reservoir 130.

Using the first cooling system 124, coolant is pumped from the coolant supply reservoir 130 to the thermally managed control module 122 via the coolant supply channel 132. Coolant flows through the thermally managed control module 122 to cool the thermally managed control module 122. More specifically, the coolant is used to maintain a temperature of the thermally managed control module 122 to below a predetermined temperature. Some coolant may be released to the coolant release reservoir 136 via the coolant release channel 134.

The second cooling system 126 includes a reservoir 140 containing a reactant material 142, a reaction channel 144 containing a reactive material 146, and a plunger channel 148 housing a plunger 150.

The reservoir 140 extends between a first reservoir end 154 and a second reservoir end 156 that is opposite the first reservoir end 154. The reservoir 140 may be formed in a cylindrical shape or another suitable shape. The first reservoir end 154 is closed and the second reservoir end 156 is open to the reaction channel 144. In other words, the reservoir 140 is in fluid communication with the reaction channel 144 via the second reservoir end 156.

A spring 158 is disposed within the reservoir 140 and positioned at the first reservoir end 154. The spring 158 is movable along the reservoir 140. The spring 158 includes a disk 160 and a spring coil 162. The disk 160 sealingly engages with an inner surface 166 of the reservoir 140. The spring coil 162 extends between the disk 160 and the first reservoir end 154 of the reservoir 140. The spring coil 162 expands to drive movement of the disk 160. More specifically, the disk 160 moves toward the second reservoir end 156 when the spring coil 162 of the spring 158 expands.

The reactant material 142 is disposed within the reservoir 140 and the reaction channel 144. Inside the reservoir 140, the reactant material is disposed between the disk 160 of the spring 158 and the second reservoir end 156 of the reservoir 140. The reactant material 142 may be water or another suitable reactant material. Movement of the spring 158 drives movement of the reactant material 142. More specifically, expansion of the spring coil 162 causes the reactant material 142 to move from the reservoir 140 and reaction channel 144 toward the coolant supply channel 132.

The reaction channel 144 extends between a first channel end 170 and a second channel end 172 that is opposite to the first channel end 170. The first channel end 170 is positioned adjacent to the second reservoir end 156 of the reservoir 140. The second channel end 172 is positioned adjacent to the coolant supply channel 132.

The reactive material 146 is positioned at the second channel end 172 of the reaction channel 144. The reactive material 146 may be ammonium nitrite, urea, or another suitable reactive material. The reactive material 146 is sealed from the reactant material 142 using a first sealing disk 176 and sealed from the coolant supply channel 132 using a second sealing disk 178.

The plunger 150 is attached to a ram 182 and movable between a retracted position, as shown in FIG. 2, and an extended position, as shown in FIGS. 3-4. In the retracted position, the plunger 150 is positioned in the plunger channel 148. In the extended position, the plunger 150 extends transversely across the coolant supply channel 132 and is positioned at least partially within the reaction channel 144. When in the extended position, the plunger 150 blocks flow of coolant, if any, traveling in the coolant supply channel 132 from the coolant supply reservoir 130. The plunger 150 ruptures the first and second sealing disks 176, 178 when in the extended position.

The plunger 150 extends between a first plunger end 184 and a second plunger end 186 that is opposite the first plunger end 184. The plunger 150 includes a first plunger side 188 and a second plunger side 190 that is opposite the first plunger side 188. A plunger nose 192 is disposed at the first plunger end 184. The plunger 150 is attached to a ram 182 at the second plunger end 186. In the illustrated example, the plunger 150 is sized and shaped to contour the plunger channel 148. However, the plunger 150 may be another suitable size and another suitable shape. The ram 182 is one example of an actuator. The ram 182 drives movement of the plunger 150 from the retracted position to the extended position.

A channel 196 extends through the plunger 150. More specifically, the channel 196 extends between the first plunger end 184 and the second plunger side 190. In the illustrated example, the channel 196 forms a right angle between the first plunger end 184 and the second plunger side 190. However, the channel 196 may have another suitable shape, such as curved between the first plunger end 184 and the second plunger side 190. When the plunger 150 is in the extended position, the first plunger end 184 of the plunger 150 is in fluid communication with the reaction channel 144 via the channel 196 and the second plunger side 190 of the plunger 150 is in fluid communication with the coolant supply channel 132 via the channel 196.

When a temperature of the thermally managed control module 122 is below a predetermined temperature as shown in FIG. 2, the ram 182 is in an unactivated state and the plunger 150 is in the retracted position.

When the temperature of the thermally managed control module 122 is greater than the predetermined temperature, the ram 182 transitions the plunger 150 from the retracted position to the extended position. In the extended position shown in FIG. 3, the plunger 150 extends transversely across the coolant supply channel 132 and blocks flow, if any, of coolant flowing from the coolant supply reservoir 130 to the thermally managed control module 122 via the first cooling system 124. The plunger nose 192 of the plunger 150 ruptures the first and second sealing disks 176, 178. As a result, the reactant and reactive materials 142, 146 mix and create an endothermic coolant 200 via an endothermic reaction between the reactant material and the reactive material.

As shown in FIG. 4, the endothermic coolant 200 flows from the reaction channel 144 and into the channel 196 of the plunger 150. As the endothermic coolant 200 begins to flow into the channel 196 of the plunger 150, a pressure inside the reaction channel 144 lowers and the spring 158 expands to push the remaining reactant material 142 into the reactional channel 144 and the endothermic coolant 200 from inside the reservoir 140 toward the channel 196 of the plunger 150. From the channel 196 of the plunger 150, the endothermic coolant 200 flows to the thermally managed control module 122 via the coolant supply channel 132 to cool the thermally managed control module 122.

Accordingly, the temperature of the thermally managed control module 122 decreases, such as to less than the predetermined temperature. Some of the endothermic coolant 200 may be released to the coolant release reservoir 136 via the coolant release channel 134. For example, 200 milliliters or another suitable volume may be released to the coolant release reservoir 136.

FIG. 5 is a schematic diagram of an example cooling system 220.

The cooling system 220 includes a thermally managed control module 222, a first cooling system 224, and a second cooling system 226.

The thermally managed control module 222 may be the same as the thermally managed control modules 102, 122. The thermally managed control module 222 includes a cold plate 230. A coolant channel 232 extends through the cold plate 230 and is configured to carry coolant to cool the cold plate 230, and thereby cool the thermally managed control module 222.

The first cooling system 224 includes a surge tank 236, an overflow tank 238, and a pump 240. The surge tank 236 is positioned outside the thermally managed control module 222 and in fluid communication with the coolant channel 232 via a coolant release channel 244. The overflow tank 238 is in fluid communication with the surge tank 236 via an overflow channel 246 and receives overflow of coolant from the surge tank 236. The pump 240 is positioned between a tank outlet 248 of the surge tank 236 and a channel inlet 250 of the coolant channel 232. The pump 240 is in fluid communication with the surge tank 236 via a coolant return channel 252 and in fluid communication with the channel inlet 250 of the coolant channel 232 via a coolant supply channel 254. A first check valve 258 is positioned between the pump 240 and the channel inlet 250 of the coolant channel 232.

Coolant is configured to flow from the coolant channel 232 to the surge tank 236 via the coolant release channel 244. At least some coolant flows from the surge tank 236 to the pump 240 via the coolant return channel 252. Some coolant may flow from the surge tank 236 to the overflow tank 238 via the overflow channel 246. The pump 240 pumps coolant from the pump 240 to the channel inlet 250 of the coolant channel 232 via the coolant supply channel 254. The first check valve 258 maintains a flow direction of coolant from the pump 240 to the channel inlet 250 of the coolant channel 232. The coolant cools the cold plate 230 of the thermally managed control module 222, and thereby cools the thermally managed control module 222.

The second cooling system 226 includes a fluid tank 264, a gas cylinder 266, and a release valve 268. The fluid tank 264 contains a fluid. In one example, the fluid may be water. A solute reservoir 270 is disposed within the fluid tank 264 and contains a solute (e.g., endothermic solute). The solute may be ammonium nitrate, urea, or another suitable solute. An agitator 272 may be disposed within the fluid tank 264 and may be positioned adjacent to the solute reservoir 270. The fluid tank 264 is in fluid communication with the coolant supply channel 254 via an endothermic coolant channel 276. The endothermic coolant channel 276 may join with the coolant supply channel 254 in a position between the first check valve 258 and the cold plate 230. A second check valve 278 may be positioned within the endothermic coolant channel 276.

The gas cylinder 266 is filled with a gas (e.g., pressurized gas). A gas channel 282 is positioned between the gas cylinder 266 and the solute reservoir 270. The release valve 268 is disposed within the gas channel 282. The release valve 268 is movable between an open position and a closed position. When the release valve 268 is in the open position, the gas cylinder 266 is in fluid communication with the solute reservoir 270 via the gas channel 282 and allows a flow of gas from the gas cylinder 266 to the solute reservoir 270. When the release valve 268 is in the closed position, the release valve 268 restricts the flow of gas between the gas cylinder 266 and the solute reservoir 270.

When a temperature of the thermally managed control module 222 is below a predetermined temperature, coolant flows through the first cooling system 224.

When the temperature of the thermally managed control module 222 is greater than the predetermined temperature, an actuator is configured to transition the release valve 268 from the closed position to the open position based on the temperature. Gas from the gas cylinder 266 flows through the gas channel 282, enters the fluid tank 264, and ruptures the solute reservoir 270. The solute in the solute reservoir 270 is released from the solute reservoir 270 and mixes with the fluid from the fluid tank 264 using the agitator 272 to form an endothermic coolant via an endothermic reaction between the solute and the fluid. The endothermic coolant flows from the fluid tank 264 to the coolant channel 232 in the cold plate 230 via the endothermic coolant channel 276 and the coolant supply channel 254. The endothermic coolant cools the cold plate 230 of the thermally managed control module 222, and thereby cools the thermally managed control module 222. Accordingly, the temperature of the thermally managed control module 222 returns to a temperature below the predetermined temperature. The endothermic coolant flows from the coolant channel 232 to the surge tank 236 via the coolant release channel 244 and some endothermic coolant may subsequently flow from the surge tank 236 to the overflow tank 238 via the overflow channel 246.

Figure 6:
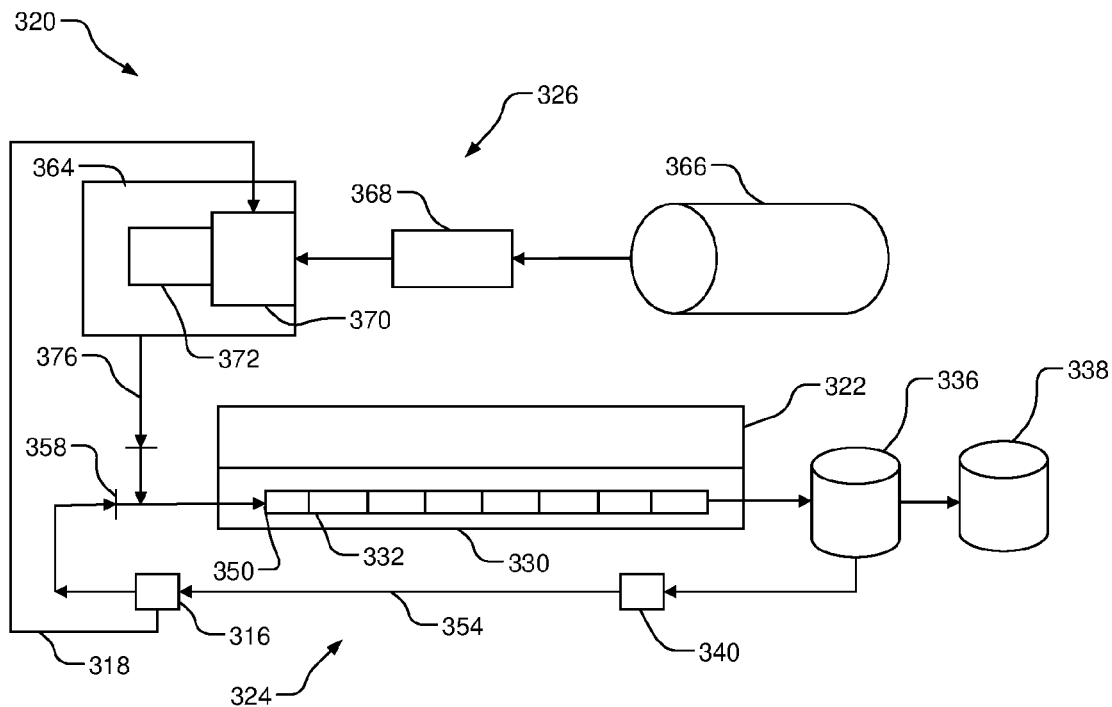
FIG. 6 is a schematic diagram of an example cooling system.

FIG. 6 is a schematic diagram of an example cooling system 320.

The cooling system 320 may be the same as the cooling system 220, with the exception that the cooling system 320 includes a mechanical valve 316 and a second coolant channel 318.

The cooling system 320 includes a thermally managed control module 322, a first cooling system 324, and a second cooling system 326. The thermally managed control module 322 may include a cold plate 330 and a coolant channel 332 extending through the cold plate 330.

The first cooling system 324 includes a surge tank 336, and overflow tank 338, and a pump 340. The pump 340 pumps coolant from the surge tank 336 to a channel inlet 350 of the coolant channel 332 via the coolant supply channel 354. A first check valve 358 is disposed between the pump 340 and the channel inlet 350 of the coolant channel 332.

The second cooling system 326 includes a fluid tank 364 containing fluid, a gas cylinder 366 containing gas, a release valve 368 movable between open and closed positions, a solute reservoir 370 containing a solute, and an agitator 372. An endothermic coolant channel 376 carries endothermic coolant from the fluid tank 364 to the coolant supply channel 354.

The mechanical valve 316 is disposed within the coolant supply channel 354. The mechanical valve 316 is positioned between the pump 340 and the first check valve 358. The mechanical valve 316 is movable between an open valve position and a closed valve position. In some configurations, the mechanical valve 316 may be a wax valve. When a coolant temperature of the coolant is greater than a predetermined coolant temperature and the coolant passes the mechanical valve 316, the wax is configured to melt and thereby moves the mechanical valve 316 from the closed position to the open position.

When the mechanical valve 316 is in the closed position, coolant flows from the pump 340 to the channel inlet 350 of the coolant channel 332 via the coolant supply channel 354.

When the mechanical valve 316 is in the open position, coolant flows from the coolant supply channel 354 to the solute reservoir 370 via the second coolant channel 318.

When a temperature of the thermally managed control module 322 is below a predetermined temperature, the coolant temperature of the coolant is below the predetermined coolant temperature, and coolant thereby flows through the first cooling system 324.

When the temperature of the thermally managed control module 322 is greater than the predetermined temperature, the coolant temperature of the coolant is greater than the predetermined coolant temperature. Because the coolant temperature is greater than the predetermined coolant temperature, the coolant causes the mechanical valve 316 to transition from the closed position to the open position. Coolant flows from the mechanical valve 316 to the solute reservoir 370 via the second coolant channel 318. The solute in the solute reservoir 370 is released from the solute reservoir 370 and mixes with the fluid from the fluid tank 364 using the agitator 372 to form an endothermic coolant via an endothermic reaction. The endothermic coolant flows from the fluid tank 364 to the coolant channel 332 in the cold plate 230 via the endothermic coolant channel 376 and the coolant supply channel 354. Endothermic coolant cools the cold plate 330 of the thermally managed control module 322, and thereby cools the thermally managed control module 322 such that the temperature of the thermally managed control module 322 returns to a temperature below the predetermined temperature. The endothermic coolant flows from the coolant channel 332 to the surge tank 336 and some endothermic coolant may subsequently flow from the surge tank 336 to the overflow tank 338.

Figure 7:
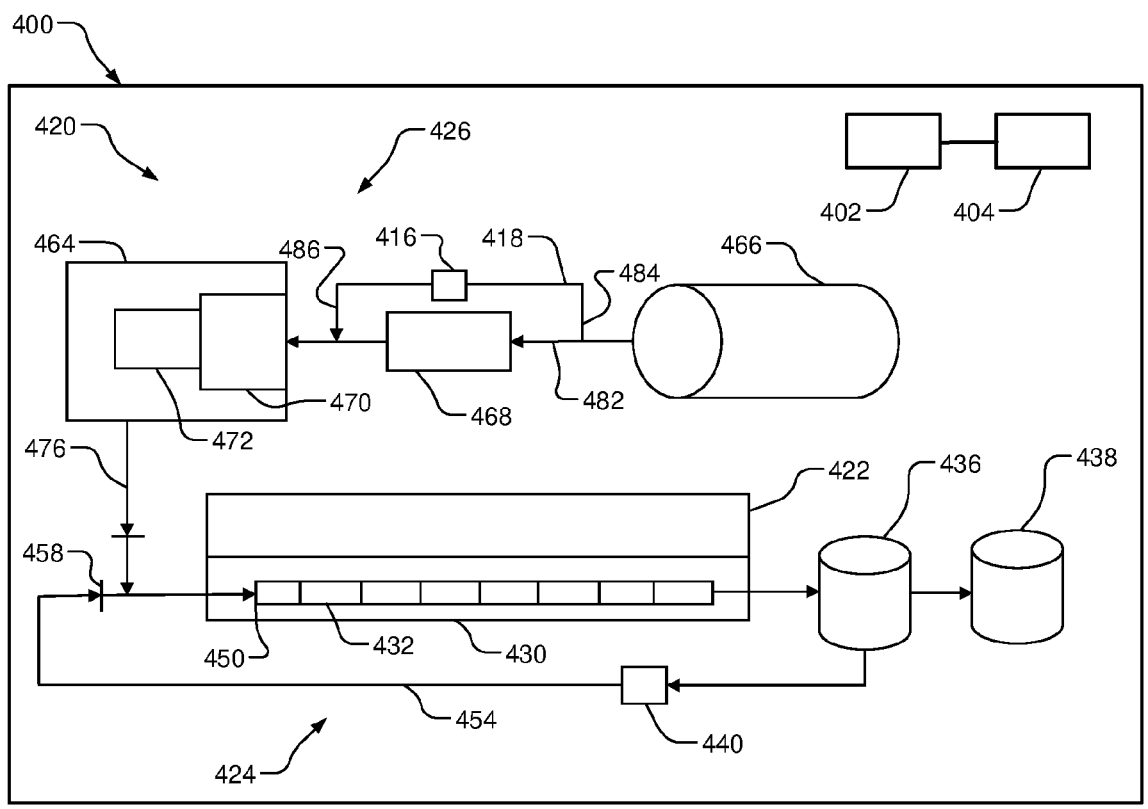
FIG. 7 is a schematic diagram of an example cooling system.

FIG. 7 is a schematic diagram of an example vehicle 400. The vehicle includes an airbag 402, an airbag control module 404, and a cooling system 420.

The cooling system 420 may be the same as the cooling system 220, with the exception that the cooling system 420 includes a bypass trigger 416 and a second gas channel 418.

The cooling system 420 includes a thermally managed control module 422, a first cooling system 424, and a second cooling system 426. The thermally managed control module 422 may include a cold plate 430 and a coolant channel 432 extending through the cold plate 430.

The first cooling system 424 includes a surge tank 436, an overflow tank 438, and a pump 440. The pump 440 pumps coolant from the surge tank 436 to a channel inlet 450 of the coolant channel 432 via a coolant supply channel 454. A first check valve 458 is disposed between the pump 440 and the channel inlet 450 of the coolant channel 432.

The second cooling system 426 includes a fluid tank 464 containing fluid, a gas cylinder 466 containing gas, and a release valve 468 movable between open and closed positions. The fluid tank 464 includes a solute reservoir 470 containing a solute and an agitator 472. An endothermic coolant channel 476 is configured to carry endothermic coolant from the fluid tank 464 to the coolant supply channel 454. A gas channel 482 extends between the gas cylinder 466 and the solute reservoir 470.

The bypass trigger 416 is positioned parallel with the release valve 468. More specifically, the bypass trigger 416 is disposed within the second gas channel 418 to bypass the release valve 468. The second gas channel 418 extends between a first channel end 484 and a second channel end 486 that opposes the first channel end 484. The second gas channel 418 is in fluid communication with the gas channel 482. The first channel end 480 is positioned between the gas cylinder 466 and the release valve 468. The second channel end 486 is positioned between the release valve 468 and the fluid tank 464.

When the airbag 402 of the vehicle 400 is not activated, coolant flows through the first cooling system 424.

When the airbag 402 of the vehicle 400 is activated, the airbag control module 404 is configured to activate the bypass trigger 416 based on the activated state of the airbag 402. The bypass trigger 416 opens the second gas channel 418 and allows gas to flow from the gas cylinder 466 to the solute reservoir 470 via the second gas channel 418. The solute is released from the solute reservoir 470 and mixes with the fluid from the fluid tank 464 using the agitator 472 to form an endothermic coolant via an endothermic reaction. The endothermic coolant flows from the fluid tank 464 to the coolant channel 432 in the cold plate 430 via the endothermic coolant channel 476 and the coolant supply channel 454. Endothermic coolant cools the cold plate 430 of the thermally managed control module 422, and thereby cools the thermally managed control module 422. The endothermic coolant flows from the coolant channel 432 to the surge tank 436 and some endothermic coolant may subsequently flow from the surge tank 436 to the overflow tank 438.

Figure 8:
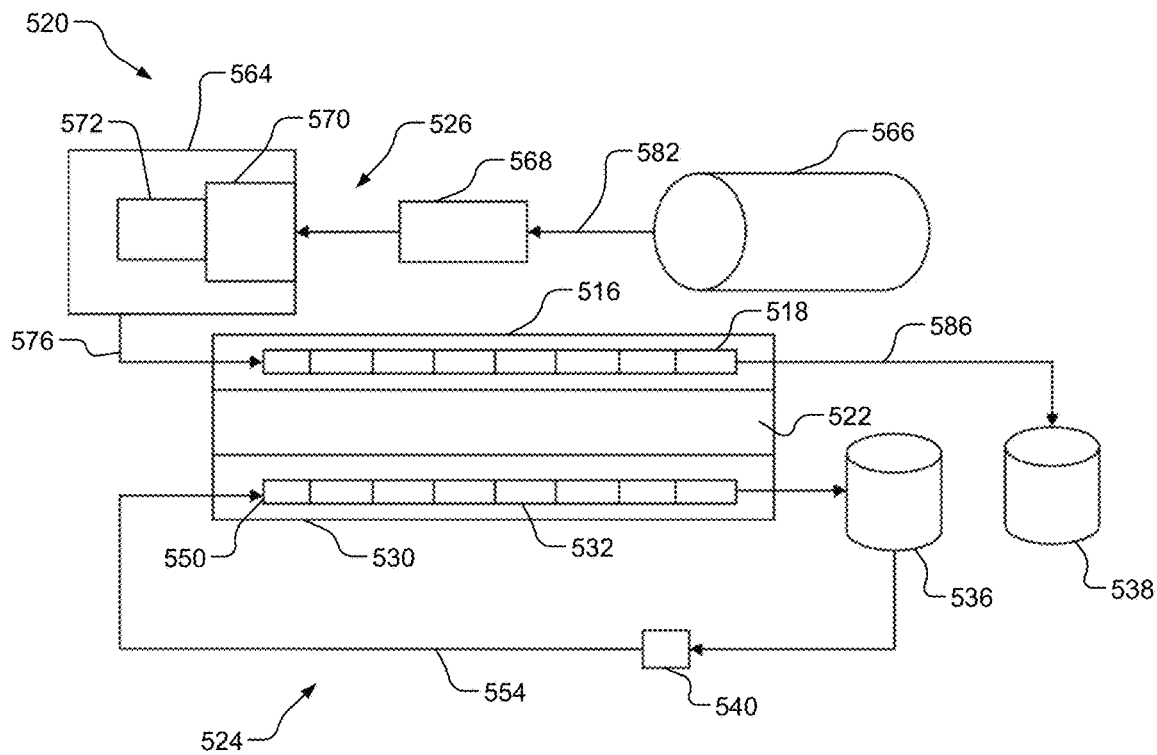
FIG. 8 is a schematic diagram of an example cooling system.

FIG. 8 is a schematic diagram of an example cooling system 520.

The cooling system 520 may be the same as the cooling system 220, with the exception that the cooling system 520 includes a second cold plate 516 with a second coolant channel 518.

The cooling system 520 includes a thermally managed control module 522, a first cooling system 524, and a second cooling system 526. The thermally managed control module 522 includes a cold plate 530 and a coolant channel 532 extending through the cold plate 530. The thermally managed control module 522 includes the second cold plate 516 and the second coolant channel 518 extending through the second cold plate 516. The cold plate 530 and the second cold plate 516 are disposed at opposing ends of the thermally managed control module 522.

The first cooling system 524 includes a surge tank 536 and a pump 440. The pump 440 pumps coolant from the surge tank 436 to the coolant channel 432 via a coolant supply channel 554.

The second cooling system 526 includes a fluid tank 564 containing fluid, a gas cylinder 566 containing gas, and a release valve 568 movable between open and closed positions. The fluid tank 564 includes a solute reservoir 570 containing a solute and an agitator 572. An endothermic coolant supply channel 576 is configured to carry endothermic coolant from the fluid tank 564 to the second coolant channel 518. A gas channel 582 extends between the gas cylinder 566 and the solute reservoir 570.

The endothermic coolant supply channel 576 is configured to carry endothermic coolant from the fluid tank 564 to cool the thermally managed control module 522. A second coolant release channel 586 extends between the second coolant channel 518 and an overflow tank 538.

When a temperature of the thermally managed control module 522 is below a predetermined temperature, coolant flows from the coolant channel 532 to the surge tank 536. At least some coolant flows from the surge tank 536 to the pump 540. The pump 540 pumps coolant from the pump 540 to a channel inlet 550 of the coolant channel 532 via the coolant supply channel 554. The coolant cools the cold plate 530 of the thermally managed control module 522, and thereby cools the thermally managed control module 522.

When the temperature of the thermally managed control module 522 is greater than the predetermined temperature, an actuator is configured to transition the release valve 568 from the closed position to the open position based on the temperature. Gas from the gas cylinder 566 flows through the gas channel 582, enters the fluid tank 564, and ruptures the solute reservoir 570. The solute in the solute reservoir 570 is released from the solute reservoir 570 and mixes with the fluid from the fluid tank 564 using the agitator 572 to form the endothermic coolant via an endothermic reaction between the solute and the fluid. The endothermic coolant flows from the fluid tank 564 to the second coolant channel 518 in the second cold plate 516 via the endothermic coolant supply channel 576. The endothermic coolant cools the second cold plate 516 of the thermally managed control module 522, and thereby cools the thermally managed control module 522. The endothermic coolant flows from the second coolant channel 518 to an overflow tank 538 via the second coolant release channel 586. Accordingly, the temperature of the thermally managed control module 522 returns to a temperature below the predetermined temperature.

Figure 9:
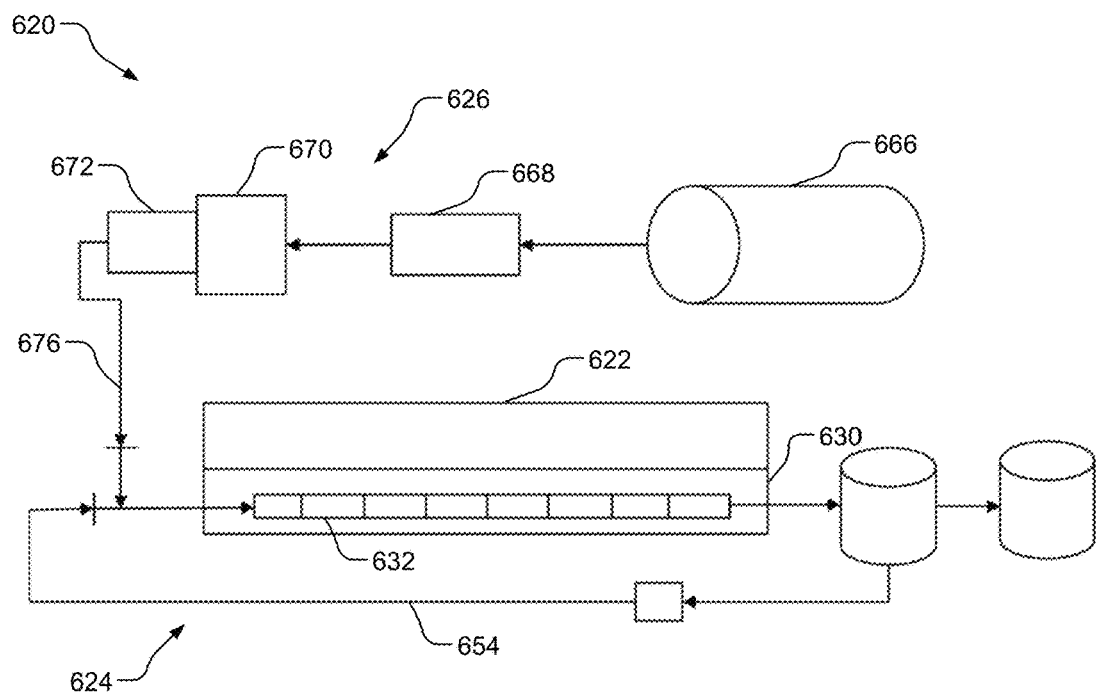
FIG. 9 is a schematic diagram of an example cooling system.

FIG. 9 is a schematic diagram of an example cooling system 620.

The cooling system 620 may be the same as the cooling system 220, with the exception that the cooling system 620 does not include a fluid tank.

The cooling system 620 includes a thermally managed control module 622, a first cooling system 624, and a second cooling system 626.

The thermally managed control module 622 includes a cold plate 630 and a coolant channel 632 extending through the cold plate 630. The first cooling system 624 includes a coolant supply channel 654. The second cooling system 626 includes a gas cylinder 666, a release valve 668, a solute reservoir 670, and an agitator 672. The fluid tank 664 is in fluid communication with the coolant supply channel 654 via an endothermic coolant channel 676.

When the temperature of the thermally managed control module 622 is less than the predetermined temperature, coolant cools the thermally managed control module 622 using the first cooling system 624.

When the temperature of the thermally managed control module 622 is greater than the predetermined temperature, an actuator moves the release valve 668 from a closed position to an open position. Gas travels from the gas cylinder 666 to the solute reservoir 670 and ruptures the solute reservoir 670. The solute in the solute reservoir 670 is released from the solute reservoir 670 and travels to the endothermic coolant channel 676 and the coolant supply channel 654. The solute mixes with coolant fluid within the coolant supply channel 654 to create an endothermic coolant via an endothermic reaction. The endothermic coolant flows from coolant supply channel 654 to the coolant channel 632 in the cold plate 630. The endothermic coolant cools the cold plate 630 of the thermally managed control module 622, and thereby cools the thermally managed control module 622 such that the temperature of the thermally managed control module 622 returns to a temperature below the predetermined temperature.

Figure 10:
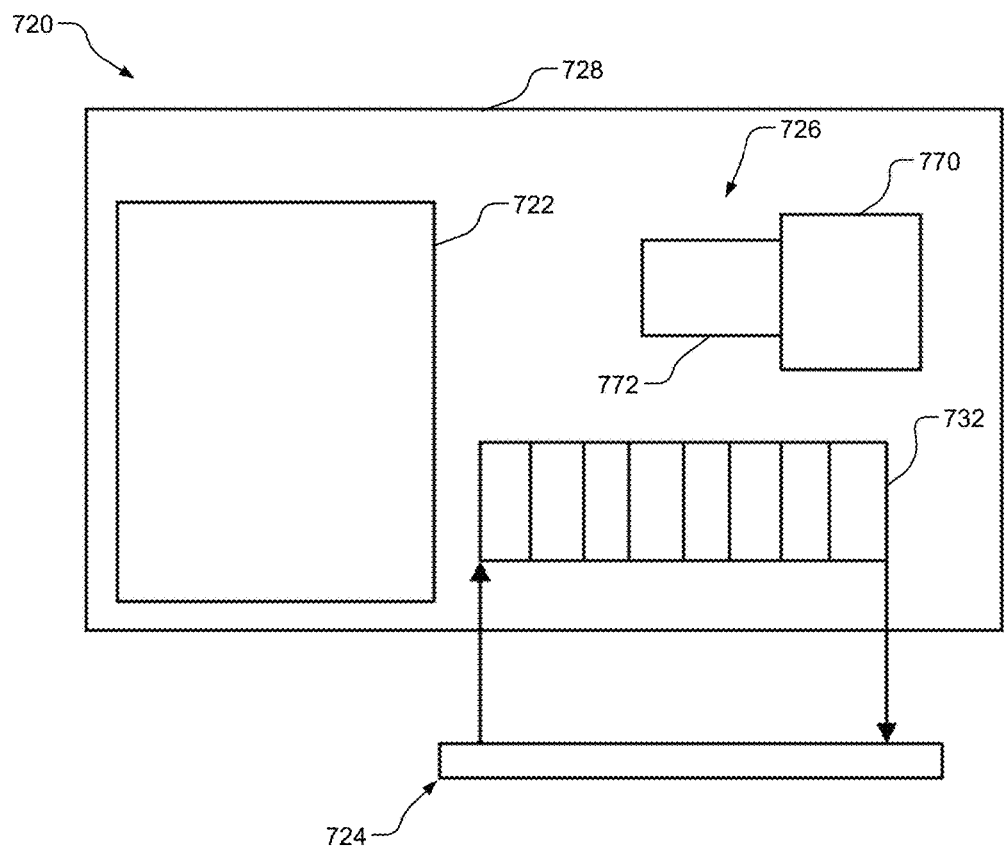
FIG. 10 is a schematic diagram of an example cooling system.

FIG. 10 is a schematic diagram of an example cooling system 720.

The cooling system 720 includes a thermally managed control module 722, a first cooling system 724, and a second cooling system 726. The thermally managed control module 722 and the second cooling system 726 are disposed within a fluid tank 728. The fluid tank 728 contains a fluid. In one example, the fluid may be water.

The first cooling system 724 may be the same as the first cooling system 224. A coolant channel 732 is disposed within the fluid tank 728 and is in fluid communication with the first cooling system 724.

The second cooling system 726 includes a solute reservoir 770 and a release assembly 772. The solute reservoir 770 is disposed within the fluid tank 728 and contains a solute. The solute may be ammonium nitrate, urea, or another suitable solute. The release assembly 772 may be disposed within the fluid tank 728 and may be positioned adjacent to the solute reservoir 770. The release assembly 772 will be described in greater detail below and with reference to FIGS. 12-14.

When a temperature of the thermally managed control module 722 is below a predetermined temperature, coolant flows through the coolant channel 732 using the first cooling system 724. The coolant flowing through the coolant channel 732 extracts heat from the fluid of the fluid tank 728 and thereby, reduces a fluid temperature of the fluid. The fluid cools the thermally managed control module 722 such that the temperature of the thermally managed control module 722 remains below the predetermined temperature. In one example, the fluid cools the thermally managed control module 822 by convection. In another example, the fluid cools the thermally managed control module 822 by forced advection.

When the temperature of the thermally managed control module 722 is greater than the predetermined temperature, the thermally managed control module 722 activates the release assembly 772. The release assembly 772 releases the solute from within the solute reservoir 770 into the fluid of the fluid tank. The solute mixes with the fluid to create an endothermic coolant via an endothermic reaction. The endothermic coolant cools the thermally managed control module 722 and returns the temperature of the thermally managed control module 722 to below the predetermined temperature.

Figure 11:
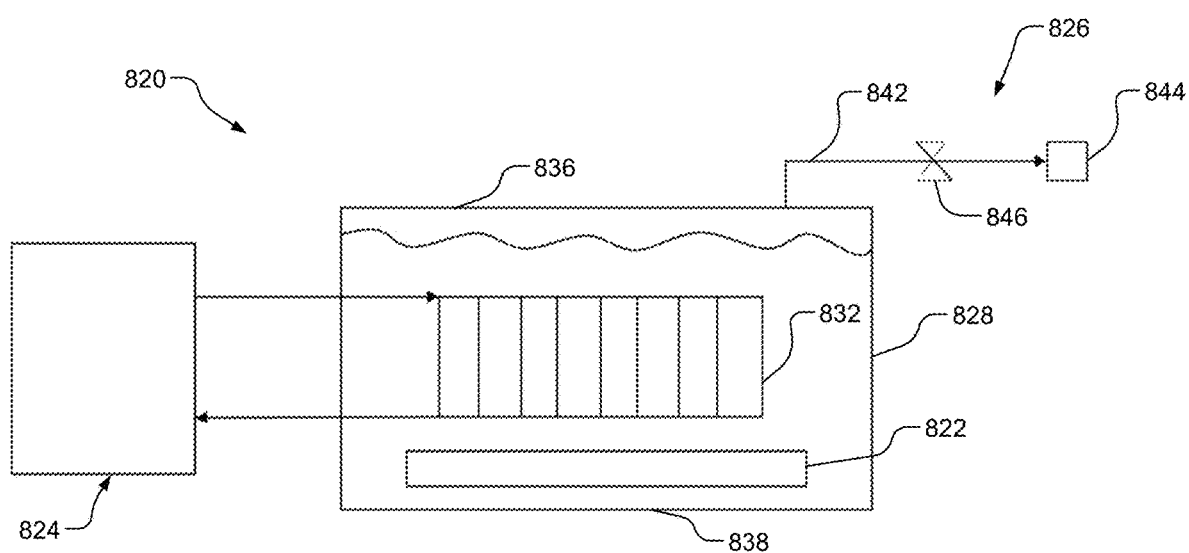
FIG. 11 is a schematic diagram of an example cooling system.

FIG. 11 is a schematic diagram of an example cooling system 820.

The cooling system 820 includes a thermally managed control module 822, a first cooling system 824, and a second cooling system 826. The thermally managed control module 822 is disposed within a fluid tank 828.

The fluid tank 828 extends between a top end 836 and a bottom end 838. The fluid tank 828 is partially filled with a fluid from the bottom end 838. In one example, the fluid may be ethanol, a refrigerant, or another suitable fluid. Gas is disposed within the fluid tank 828 and positioned at the top end 836 of the fluid tank 828. The thermally managed control module 822 is disposed within the fluid of the fluid tank 828.

The first cooling system 824 may be the same as the first cooling system 224. A coolant channel 832 is disposed within the fluid of the fluid tank 828 and is in fluid communication with the first cooling system 824.

The second cooling system 826 includes a gas channel 842, a vent 844, and pressure relief valve 846. The vent 844 is positioned outside the fluid tank 828. The vent 844 is in communication with the top end 836 of the fluid tank 828 via the gas channel 842.

The pressure relief valve 846 is disposed within the gas channel 842 to restrict and controls flow of gas from the fluid tank 828 to the vent 844. The pressure relief valve 846 is movable between an open position and a closed position. When a pressure in the gas channel 842 between the fluid tank 828 and the pressure relief valve 846 is below a predetermined pressure (e.g., a cracking pressure), the pressure relief valve 846 is in the closed position and restricts flow of gas from the fluid tank 828 to the vent 844. When the pressure in the gas channel 842 between the fluid tank 828 and the pressure relief valve 846 is above the predetermined pressure, the pressure relief valve 846 opens to the open position and allows release of gas from the fluid tank 828 and out the vent 844.

When a temperature of the thermally managed control module 822 is below a predetermined temperature, coolant flows through the coolant channel 832 using the first cooling system 824. The coolant flowing through the coolant channel 832 extracts heat from the fluid of the fluid tank 828 and thereby, reduces a fluid temperature of the fluid. The fluid cools the thermally managed control module 822 such that the temperature of the thermally managed control module 822 remains below the predetermined temperature. In one example, the fluid cools the thermally managed control module 822 by convection. In another example, the fluid cools the thermally managed control module 822 by forced advection.

When the temperature of the thermally managed control module 822 reaches the predetermined temperature, the fluid temperature of the fluid reaches a saturation point of the fluid and begins to evaporate. In other words, the fluid is converted into a gas. The conversion from fluid into a gas increases the pressure in the fluid tank 828 and in the gas channel 842 between the fluid tank 828 and the pressure relief valve 846. More specifically, the pressure is greater than the predetermined pressure and the pressure relief valve 846 moves from the closed position to the open position. Subsequently, gas flows from the fluid tank 828, through the gas channel 842, and out the vent 844. Accordingly, release of gas from the fluid tank 828 reduces the fluid temperature of the fluid in the fluid tank 828 and reduces the temperature of the thermally managed control module 822 such that the temperature of the thermally managed control module 822 is at or below the predetermined temperature.

Figure 12:
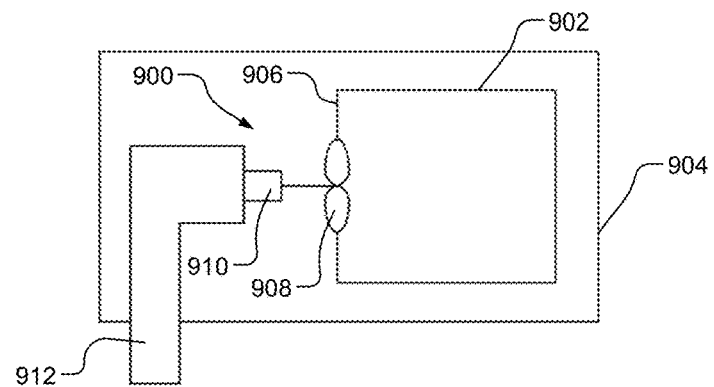
FIG. 12 is a schematic diagram of an example release assembly.

FIG. 12 is a schematic diagram of an example release system 900 for an example solute reservoir 902. The release system 900 may replace the agitator 272, 372, 472, 672 of the cooling system 220, 320, 420, 620, respectively, and may be the release assembly 772 of the cooling system 720.

The solute reservoir 902 is disposed in a fluid tank 904. The fluid tank 904 is filled with a fluid and the solute reservoir 902 contains a solute. The solute reservoir 902 includes sidewalls 906 that are made of a soft membrane.

The release system 900 includes an impeller 908, a motor 910, and an arm 912. The impeller 908 is in contact with one of the sidewalls 906 of the solute reservoir 902 and is rotatably relative to the solute reservoir 902. The motor 910 is electrically connected to the impeller 908 and powers rotational movement of the impeller 908. The arm 912 is fixed to the motor 910 and positions the impeller 908 adjacent to the one of the sidewalls 906.

Activation of the motor 910 drives rotational movement of the impeller 908 and rotational movement of the impeller 908 pierces the one of the sidewalls 906 of the solute reservoir 902 to release the solute into the fluid tank 904. Further rotational movement of the impeller 908 functions as an agitator and mixes the solute with the fluid. The solute and the fluid mix under an endothermic reaction and creates an endothermic coolant via an endothermic reaction.

Figure 13:
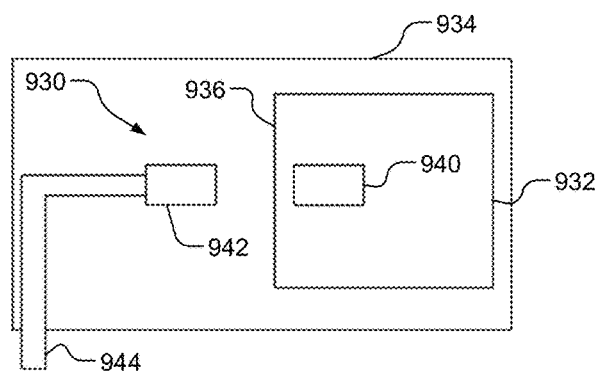
FIG. 13 is a schematic diagram of an example release assembly.

FIG. 13 is a schematic diagram of an example release system 930 for an example solute reservoir 932. The release system 930 may replace the agitator 272, 372, 472, 672 of the cooling system 220, 320, 420, 620, respectively, and may be the release assembly 772 of the cooling system 720.

The solute reservoir 932 is disposed in a fluid tank 934. The fluid tank 934 is filled with a fluid and the solute reservoir 932 contains a solute. The solute reservoir 932 includes sidewalls 936 that are made of a soft membrane.

The release system 930 includes a magnet 940, a solenoid 942, and an arm 944. The magnet 940 is disposed within the solute reservoir 932. The solenoid 942 is disposed outside the solute reservoir 932 and within the fluid tank 934. The solenoid 942 is positioned adjacent to the magnet 940. More specifically, the solenoid 942 may be aligned with the magnet 940. The arm 944 is fixed to the solenoid 942 and holds the solenoid 942 adjacent to the magnet 940.

Activation of the solenoid 942 drives movement of the magnet 940. More specifically, the solenoid 942 attracts the magnet 940 and the magnet 940 pierces through the one of the sidewalls 936 of the solute reservoir 932 to release the solute into the fluid tank 934. The solute and the fluid mix to create an endothermic coolant via an endothermic reaction.

Figure 14:
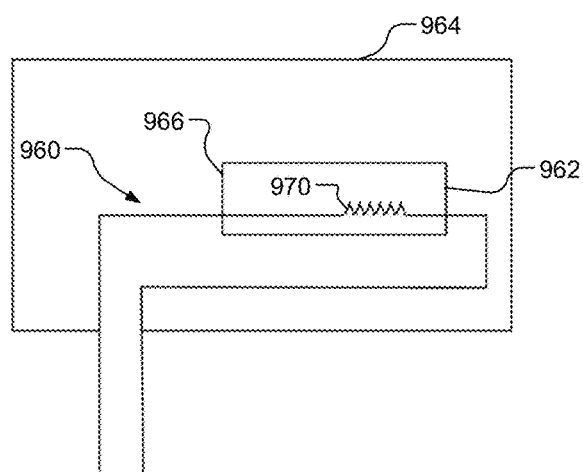
FIG. 14 is a schematic diagram of an example release assembly.

FIG. 14 is a schematic diagram of an example release system 960 for an example solute reservoir 962. The release system 960 may replace the agitator 272, 372, 472, 672 of the cooling system 220, 320, 420, 620, respectively, and may be the release assembly 772 of the cooling system 720.

The solute reservoir 962 is disposed in a fluid tank 964. The fluid tank 964 is filled with a fluid and the solute reservoir 962 contains a solute. The solute reservoir 962 includes sidewalls 966 that are made of a soft membrane.

The release system 960 includes a fuse 970 that extends through at least one sidewall 966 of the solute reservoir 962. In the illustrated example, the fuse 970 extends through two sidewalls 966 that are positioned at opposite ends of the solute reservoir 962.

Current travels through the fuse 970 and is operable to melt the at least one sidewall 966 of the solute reservoir 962 to release the solute into the fluid tank 964. The solute and the fluid mix to create an endothermic coolant via an endothermic reaction.

Figure 15:
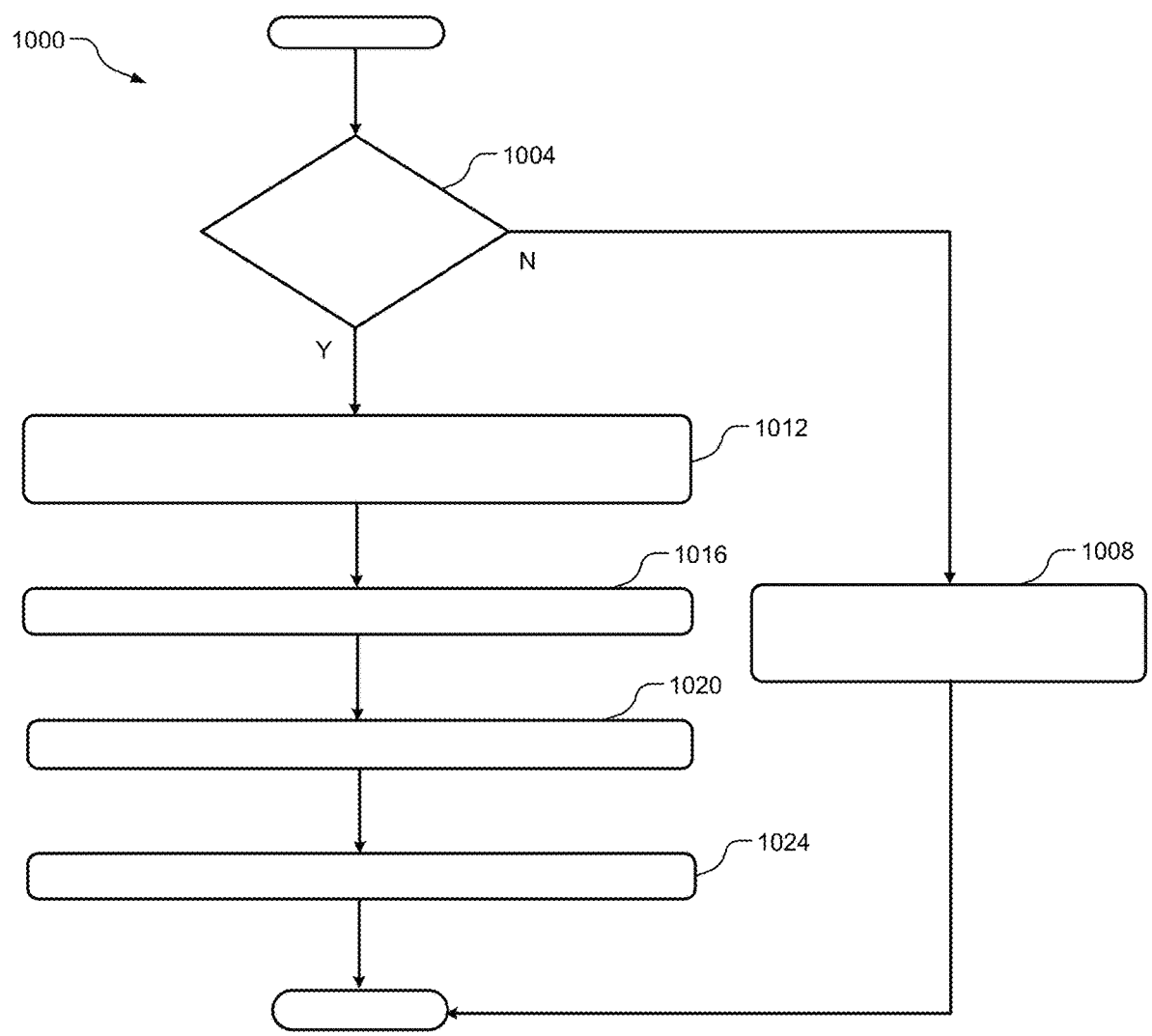
FIG. 15 is a flow chart of an example method for operating the cooling system.

FIG. 15 is a flow chart of an example method 1000 for operating the cooling system. The cooling system may be any of the cooling systems 120, 220, 320, 420, 520, 620, 720, 820.

At 1004, the thermally managed control module determines whether a temperature of the thermally managed control module is greater than a predetermined temperature. If 1004 is not true (e.g., the temperature does not exceed the predetermined temperature), the method continues to 1008. If 1004 is true (e.g., the temperature is greater than the predetermined temperature), the method continues to 1012.

At 1008, the first cooling system cools the thermally managed control module.

At 1012, the second cooling system begins to cool the thermally managed control module. In some examples, the second cooling system may cool the thermally managed control module for a time period. The time period may be a time period of about 5 minutes, or another suitable time period.

At 1016, the thermally managed control module notifies a host control module of the vehicle based on the temperature of the thermally managed control module.

At 1020, the host control module brings the vehicle to a predetermined state based on the notification received from the thermally managed control module. For example, the host control module steers the vehicle to a location, such as a nearby shoulder of a road, a nearby parking lot, or another suitable location.

At 1024, the second cooling system is replaced by an owner of the vehicle. In some examples, the pressurized gas cylinder is replaced. In some examples, the second cooling system are flushed of the endothermic coolant with a second fluid. In some examples, the fluid of the fluid tank is replaced with a third fluid.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5$^{th}$ revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A cooling system comprising:
a reactant material;
a reactive material spaced apart from the reactant material;
a thermally managed control module configured to receive coolant from a coolant supply reservoir via a coolant supply channel;
a plunger movable between a retracted position and an extended position; and
an actuator configured to, when a temperature of the thermally managed control module is greater than a predetermined temperature, transition the plunger from the retracted position to the extended position and cause the reactive material to mix with the reactant material to create a second coolant via an endothermic reaction, and the second coolant enters the thermally managed control module via the coolant supply channel.

2. The cooling system of claim 1, further comprising a plunger channel in fluid communication with the coolant supply channel and housing the plunger and the actuator.

3. The cooling system of claim 2, wherein:
the actuator is a ram; and
when the temperature of the thermally managed control module is greater than the predetermined temperature, the ram drives movement of the plunger from the retracted position to the extended position.

4. The cooling system of claim 2, further comprising:
a first sealing disk disposed between the reactant material and the reactive material; and
a second sealing disk disposed between the reactive material and the coolant supply channel.

5. The cooling system of claim 4, wherein:
the plunger is disposed within the plunger channel when in the retracted position, and
the plunger extends transversely across the coolant supply channel and ruptures the first and second sealing disks when transitioning from the retracted position to the extended position.

6. The cooling system of claim 5, wherein the plunger includes a channel and the channel carries the second coolant to the coolant supply channel when the plunger is in the extended position.

7. A cooling system comprising:
a fluid tank containing a fluid;
a solute reservoir disposed within the fluid tank and containing an endothermic solute;
a thermally managed control module having a coolant channel extending through the thermally managed control module and the coolant channel configured to receive a coolant; and
an actuator configured to, when a temperature of the thermally managed control module is greater than a predetermined temperature, release the endothermic solute from the solute reservoir into the fluid tank and cause the endothermic solute to mix with the fluid to create a second coolant via an endothermic reaction, and the second coolant enters the thermally managed control module via a coolant supply channel.

8. The cooling system of claim 7, further comprising:
a gas cylinder attached to the solute reservoir and filled with a pressurized gas; and
a release valve disposed between the gas cylinder and the solute reservoir and movable between an open position and a closed position,
wherein when the temperature of the thermally managed control module is greater than the predetermined temperature, the actuator is configured to transition the release valve from the closed position to the open position and allow the pressurized gas to flow from the gas cylinder to the solute reservoir and release the endothermic solute from the solute reservoir into the fluid.

9. The cooling system of claim 8, further comprising:
a bypass trigger disposed between the gas cylinder and the solute reservoir,
an airbag control module configured to activate the bypass trigger based on an activated state of an airbag,
wherein when the bypass trigger is activated, the bypass trigger is configured to allow the pressurized gas to flow from the gas cylinder to the solute reservoir and release the endothermic solute from the solute reservoir into the fluid tank to create the second coolant via the endothermic reaction, and the second coolant enters the coolant channel of the thermally managed control module via the coolant supply channel.

10. The cooling system of claim 7, further comprising:
a pump disposed outside the thermally managed control module and configured to pump the coolant from an outlet of the coolant channel to an inlet of the coolant channel.

11. The cooling system of claim 10, further comprising:
a mechanical valve disposed between the pump and the inlet of the coolant channel and movable between an open position and a closed position,
wherein when a coolant temperature of the coolant is above a predetermined coolant temperature, the coolant transitions the mechanical valve from the closed position to the open position and causes the endothermic solute to release from the solute reservoir into the fluid tank to create the second coolant via the endothermic reaction, and the second coolant enters the coolant channel of the thermally managed control module via the coolant supply channel.

12. The cooling system of claim 7, wherein the thermally managed control module includes a cold plate and the coolant channel extends through the cold plate.

13. The cooling system of claim 12, wherein the thermally managed control module includes a second coolant channel extending through a second plate and the second coolant channel is configured to receive the second coolant from the fluid tank via the coolant supply channel.

14. A cooling system comprising:
a fluid tank at least partially filled with a fluid; the fluid has a fluid temperature;
a thermally managed control module disposed within the fluid tank;
a coolant channel extending through the fluid tank and configured to receive a coolant to cool the fluid in the fluid tank; and
an actuator configured to, when the fluid temperature of the fluid is greater than a predetermined temperature, cool the fluid temperature to less than the predetermined temperature by at least one of evaporating the fluid and mixing the fluid with an endothermic solute.

15. The cooling system of claim 14, further comprising:
a solute reservoir disposed within the fluid tank and containing the endothermic solute,
wherein when the fluid temperature is greater than the predetermined temperature, the actuator is configured to release the endothermic solute from the endothermic solute into the fluid of the fluid tank using a release assembly.

16. The cooling system of claim 15, wherein the release assembly includes an impeller disposed adjacent to the solute reservoir and rotation of the impeller pierces a sidewall of the solute reservoir such that the endothermic solute is released into the fluid of the fluid tank.

17. The cooling system of claim 15, wherein:
the release assembly includes a magnet disposed inside the solute reservoir and a solenoid disposed outside the solute reservoir, and
the solenoid attracts the magnet and pierces a sidewall of the solute reservoir such that the endothermic solute is released into the fluid of the fluid tank.

18. The cooling system of claim 15, wherein the release assembly includes a fuse disposed inside the solute reservoir, and current traveling through the fuse is configured to melt a sidewall of the solute reservoir such that the endothermic solute is released into the fluid of the fluid tank.

19. The cooling system of claim 14, wherein the fluid tank is at least partially filled with a gas.

20. The cooling system of claim 19, further comprising:
a pressure relief valve movable between an open position and a closed position,
wherein when the fluid temperature is greater than the predetermined temperature, the fluid in the fluid tank evaporates and the gas causes the pressure relief valve to transition from the closed position into the open position to release the gas from the fluid tank via a vent.

* * * * *